(12) United States Patent
Tanaka

(10) Patent No.: US 6,759,698 B2
(45) Date of Patent: Jul. 6, 2004

(54) SEMICONDUCTOR INTEGRATED CIRCUIT

(75) Inventor: Genichi Tanaka, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/193,250

(22) Filed: Jul. 12, 2002

(65) Prior Publication Data
US 2003/0136977 A1 Jul. 24, 2003

(30) Foreign Application Priority Data
Jan. 23, 2002 (JP) ......................................... 2002-014532

(51) Int. Cl.$^7$ .............................................. H01L 27/10
(52) U.S. Cl. ...................... 257/206; 257/203; 257/204; 257/207; 257/378; 326/101
(58) Field of Search ................................. 257/203, 204, 257/206, 207, 378, 69, 365, 393; 326/101; 716/1

(56) References Cited

U.S. PATENT DOCUMENTS

| | | | |
|---|---|---|---|
| 4,766,476 A | * | 8/1988 | Schallenberger et al. ... 257/206 |
| 5,514,895 A | * | 5/1996 | Kikushima et al. ......... 257/378 |
| 5,581,202 A | * | 12/1996 | Yano et al. .................. 326/101 |
| 5,698,873 A | * | 12/1997 | Colwell et al. ............. 257/206 |
| 2003/0023936 A1 | * | 1/2003 | McManus et al. ............. 716/1 |

FOREIGN PATENT DOCUMENTS

| | | |
|---|---|---|
| JP | 10-150175 | 6/1998 |
| JP | 10-189749 | 7/1998 |
| JP | 11-031803 | 2/1999 |
| JP | 11-224901 | 8/1999 |

* cited by examiner

Primary Examiner—Hoai Ho
Assistant Examiner—Dao H. Nguyen
(74) Attorney, Agent, or Firm—Burns, Doane, Swecker & Mathis, LLP

(57) ABSTRACT

A semiconductor integrated circuit includes cells, cell rows and potential feeders. Each cell includes a partial trunk that is used to constitute a power supply trunk and/or a ground trunk, and that is electrically isolated from the remaining components within the cell. Each cell row includes a plurality of cells placed adjacently, and the power supply trunk and/or ground trunk composed of the partial trunks. The potential feeders selectively connect one of the power supply trunk and ground trunk of any one of the plurality of cell rows to the components within the cells to supply them with the potential of the power supply trunk and/or ground trunk. This enables the components in the adjacent cells to be supplied with different potentials.

6 Claims, 8 Drawing Sheets

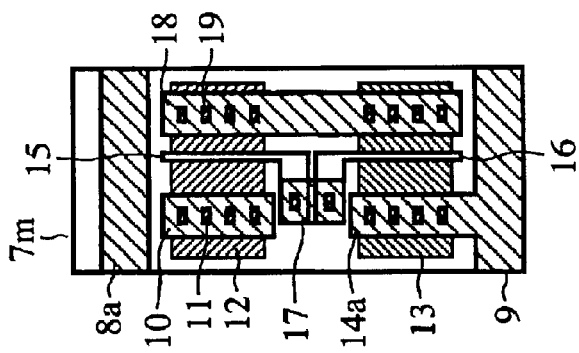
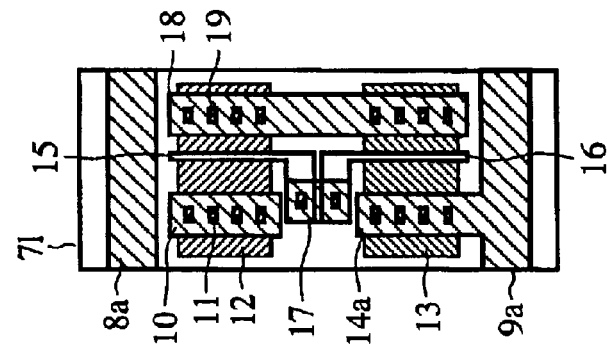
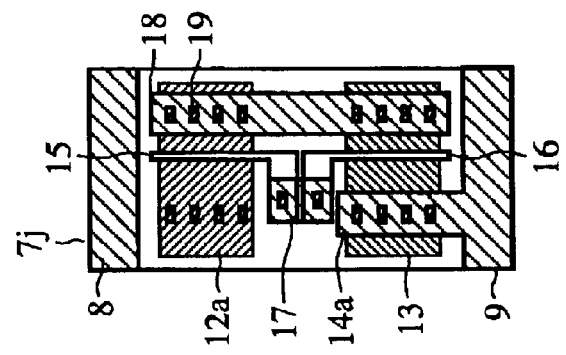
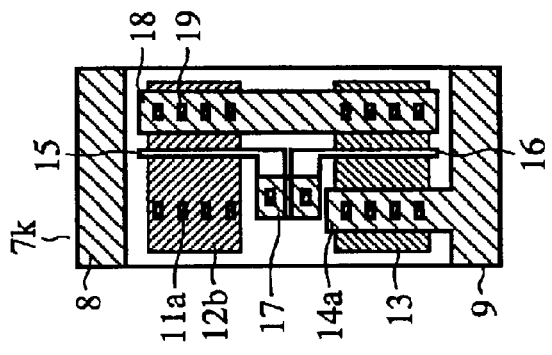
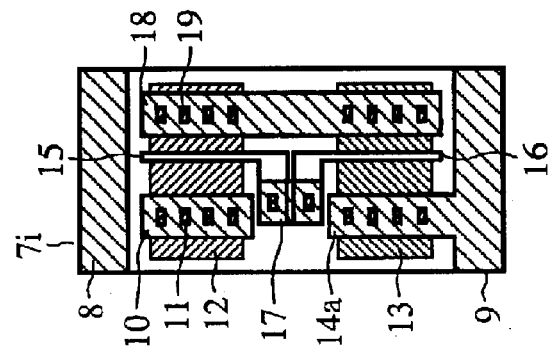

SEMICONDUCTOR INTEGRATED CIRCUIT

BACKGROUND OF THE INVENTION

1. Field of the Invention

The present invention relates to a semiconductor integrated circuit, and particularly to improvement in a cell structure primarily used in the automatic placement and routing in the layout design of a semiconductor integrated circuit.

2. Description of Related Art

FIG. 8 is a plan view showing a cell structure used for designing a conventional semiconductor integrated circuit. In FIG. 8, the reference numeral 100 designates a cell, which is an inverter in this case. The reference numeral 101 designates a power supply trunk placed in the cell 100, and 102 designates a ground trunk placed in the cell 100. The reference numeral 103 designates a metal line of the source electrode of a PMOSFET placed at a power supply side; and 104 designates a contact connecting the metal line 103 to the active region 105 of the PMOSFET. The metal line 103 is also connected to the power supply trunk 101. The reference numeral 106 designates the active region of an NMOSFET; and 107 designates a metal line of the source electrode of the NMOSFET placed on the ground side. The metal line 107 is connected to the active region 106 via the contacts 104. The reference numeral 108 designates a gate electrode of the PMOSFET; 109 designates a gate electrode of the NMOSFET; and 110 designates a metal line for interconnecting the gate electrodes 108 and 109. The metal line 110 functions as an input pin of the inverter. The reference numeral 111 designates a metal line at the output side; and 112 designates a contact for connecting the metal line 111 to the active regions 105 and 106.

Next, the outline of the conventional cell will be described.

As shown in FIG. 8, the cell used for the conventional automatic placement and routing is configured such that the power supply trunk 101 is connected to the metal line 103 of the source electrode on the power supply side in advance, and the ground trunk 102 is connected to the metal line 107 of the source electrode on the ground side in advance. Thus, the cell 100 constituting the inverter operates at the power supply potential fed via the power supply trunk 101.

When a plurality of cells 100 are automatically placed adjacently, the cells 100 are connected to the power supply trunk 101 and ground trunk 102 that supply the common potential because of the routing structure described above. Accordingly, two adjacent cells 100 are connected in common to the power supply and ground with the same potentials without exception.

With the configuration as described above, the conventional semiconductor integrated circuit has the following problem. Because the power supply trunk 101 is connected to the metal line 103 of the source electrode on the power supply side, and the ground trunk 102 is connected to the metal line 107 of the source electrode on the ground side within the cell 100 in advance, and hence the power supply trunk and ground trunk are used in common, it is unavoidable that the adjacent cells 100 have the same potential. Accordingly, it is impossible to connect the power supplies with different potentials to the adjacent cells 100. As a result, to control the power supply voltage individually for each cell 100, the cells 100 that are connected to power supplies with different potentials must be separated, thereby complicating the layout.

SUMMARY OF THE INVENTION

The present invention is implemented to solve the foregoing problem. It is therefore an object of the present invention to provide a semiconductor integrated circuit capable of connecting the adjacent cells to a plurality of power supplies with different potentials.

According to one aspect of the present invention, there is provided a semiconductor integrated circuit including cells and potential feeders. Each cell includes a partial trunk which is used to constitute a power supply trunk and/or ground trunk, and is electrically isolated from remaining components within the cell. The potential feeders are selectively connected to the power supply trunk and/or ground trunk of any one of cell rows, and supply the components within the cells with a potential fed via the power supply trunk and/or ground trunk. Thus, the semiconductor integrated circuit can supply the adjacent cells with different potentials, thereby offering an advantage of being able to control the potentials to be supplied to the cells on a cell by cell basis with ease.

BRIEF DESCRIPTION OF THE DRAWINGS

FIGS. 5A–5E are plan views showing variations of cells used for the layout of a semiconductor integrated circuit of an embodiment 3 in accordance with the present invention;

DETAILED DESCRIPTION OF THE PREFERRED EMBODIMENTS

The invention will now be described with reference to the accompanying drawings.

Embodiment 1

Figure 1:
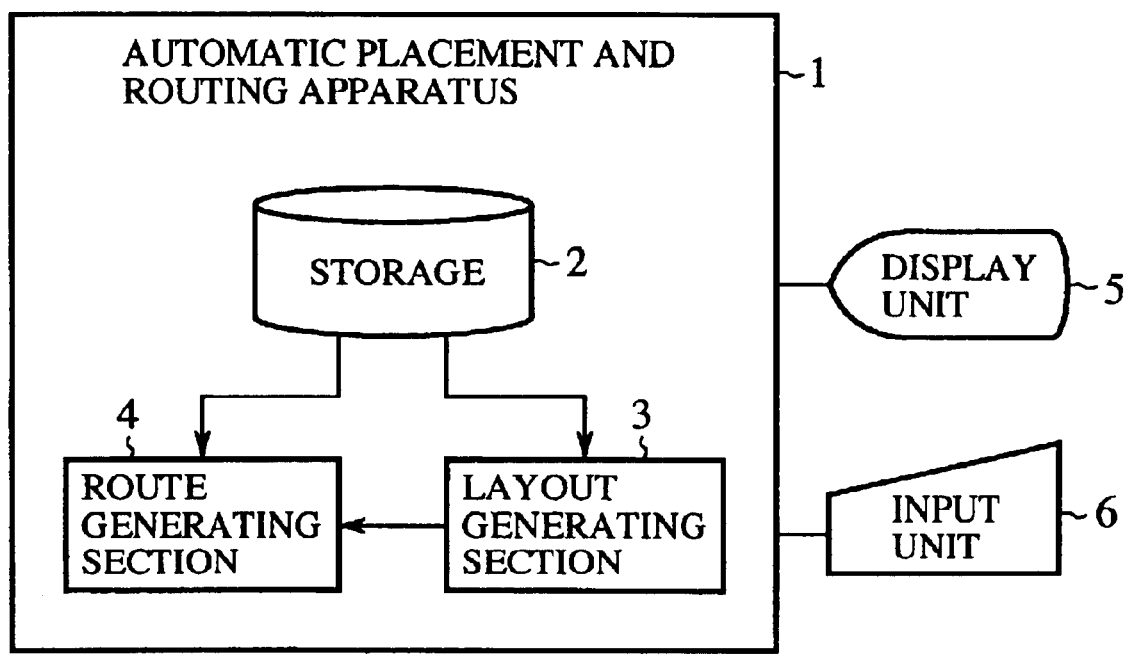
FIG. 1 is a block diagram showing a configuration of a layout apparatus of a semiconductor integrated circuit of an embodiment 1 in accordance with the present invention.

FIG. 1 is a block diagram showing a configuration of a layout apparatus of a semiconductor integrated circuit of an embodiment 1 in accordance with the present invention. In FIG. 1, the reference numeral 1 designates an automatic placement and routing apparatus of the present embodiment 1, which is composed of a computer unit that executes a program having functions of a layout generating section 3 and a route generating section 4. The automatic placement and routing apparatus 1 completes the layout design of the semiconductor integrated circuit using a set of logic/circuit cells prepared in a storage 2. The storage 2 of the automatic placement and routing apparatus 1 stores information about networks of cells and metal lines along with network information defining connections between them. Here, the cells include partial trunks constituting a power supply trunk and a ground trunk in such a manner that they are electrically isolated from the other components inside the cells. The network supplies the potential from the power supply trunk or ground trunk to the components of the cells. As the storage 2, it is possible to use a hard disk drive of the computer unit constituting the automatic placement and routing apparatus 1, or storing media such as a CD-ROM or DVD capable of reading and writing data through a driving unit.

The layout generating section 3 carries out automatic placement of layout configuration data such as about cells read from the storage 2, and generates a layout of the semiconductor integrated circuit. The route generating section 4 carries our automatic routing that connects the cells, power supply truck and ground trunk placed in the semiconductor integrated circuit layout by metal lines (potential feeding section) in accordance with design rules and various restrictions. The reference numeral 5 designates a display unit for displaying processing results of the layout generating section 3 and route generating section 4. It includes software for executing display control in addition to hardware such as a CRT or LCD of the computer unit for implementing the automatic placement and routing apparatus 1. The reference numeral 6 designates an input unit for a user of the automatic placement and routing apparatus 1 to input data necessary for the layout design. It includes a keyboard and an interface needed for entering data from outside.

Figure 2A:
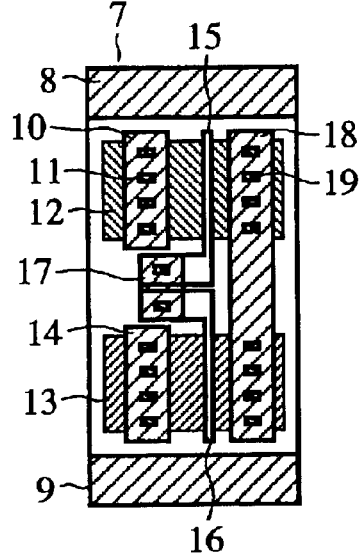
FIGS. 2A–2D are plan views showing configurations of cells and a partial layout of a semiconductor integrated circuit used by the layout apparatus of FIG. 1.
Figure 2D:
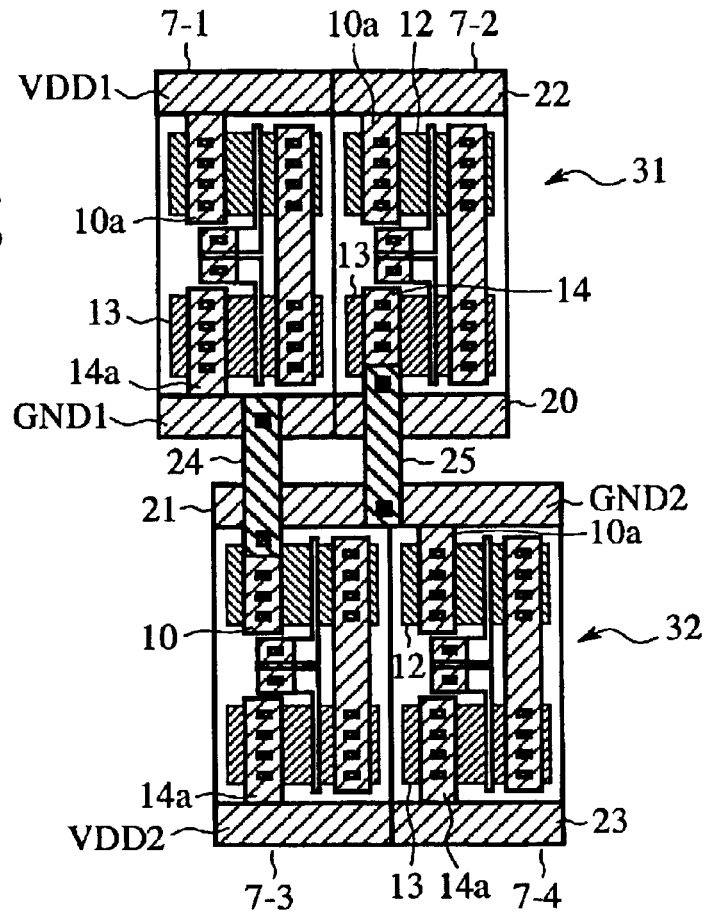
Figure 2B:
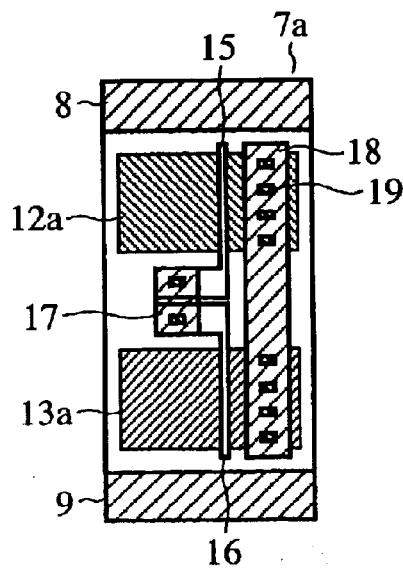
Figure 2C:
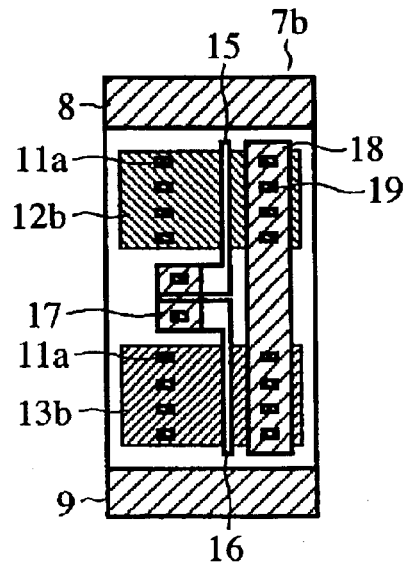

FIGS. 2A–2D are plan views showing configurations of the cells and partial semiconductor integrated circuit layout used by the layout apparatus of FIG. 1. FIGS. 2A–2C show cells constituting an inverter, and FIG. 2D shows a portion of the semiconductor integrated circuit layout after the automatic routing, which is constructed by using the cell of FIG. 2A. In these figures, reference numerals 7, 7a, 7b, 7-1–7-4 each designate a cell, in which intra-cell trunks (partial trunks) constituting the power supply trunk and ground trunk are electrically isolated from the remaining components within the cell. Reference numerals 8 and 9 each designate an intra-cell trunk (partial trunks) disposed along a layout frame (cell frame) of the cell. The reference numeral 10 designates a metal line (potential feeder) for the source electrode of the PMOSFET; and 10a designates a metal line (potential feeder) for connecting the metal line 10 to the power supply trunk or ground trunk. The reference numeral 11 designates a contact for connecting the metal line 10 to the active region 12 of a PMOSFET.

Reference numerals 12, 12a, and 12b each designate the active region of the PMOSFET, 13, 13a and 13b each designate the active region of an NMOSFET, and the reference numeral 14 designate a metal line (potential feeder) of the source electrode of the NMOSFET. The metal line 14 is also connected to the active region 13 via the contracts 11. The reference numeral 14a designates a metal line (voltage potential feeder) for connecting the metal line 14 to the ground trunk or power supply trunk. The reference numeral 15 designates a gate electrode of the PMOSFET, 16 designates a gate electrode of the NMOSFET, and 17 designates a metal line for connecting the gate electrodes 15 and 16. The metal line 17 serves as an input pin to the inverter.

The reference numeral 18 designates an output side metal line, and 19 designates a contact for connecting the metal line 18 to the active regions 12 and 13. Reference numerals 20 and 23 each designate a trunk constructed by connecting the intra-cell trunks 9 of the cells 7-1 to 7-4; and 21 and 22 each designates a trunk composed by connecting the intra-cell trunks 8 of the cells 7-1 to 7-4. They constitutes the ground trunk or power supply trunk. It is assumed here that the trunks 22 and 23 are power supply trunks supplied with different potentials VDD1 and VDD2, respectively, and that the trunks 20 and 21 are ground trunks supplied with different ground potentials GND1 and GND2. The reference numeral 24 designates a metal line (voltage potential feeder) for connecting the metal line 10 of the cell 7-3 to the ground trunk 20, and 25 designates a metal line (voltage potential feeder) for connecting the metal line 14 of the cell 7-2 to the ground trunk 21.

Next, the operation of the present embodiment 1 will be described.

Here, the description is made by way of example where the layout as shown in FIG. 2D is generated using the cell 7 as shown in FIG. 2A. It is further assumed here that the cells 7-1 to 7-4 of FIG. 2D have the same configuration as the cell 7 as shown in FIG. 2A before the automatic placement and routing.

First, the layout generating section 3 places the cells in accordance with the connection relationships between the network and cells defined by the network information. More specifically, the layout generating section 3 constructs a row of adjacent cells, which is designed and registered into the storage 2 in advance as a fundamental circuit of the layout. Thus, the layout generating section 3 generates the semiconductor integrated circuit layout by using the fundamental circuit consisting of the cell row repeatedly in accordance with the connection relationships between the networks and cells defined by the network information.

In the example of FIG. 2D, cell rows 31 and 32 are composed of the cells 7-1 and 7-2, and cells 7-3 and 7-4 so that the two cell rows 31 and 32 with the power supply trunk 22 and ground trunk 20, and power supply trunk 23 and ground trunk 21 are placed adjacently. In this case, the two cell rows 31 and 32 are spaced by a certain amount considering the cell frame so that the ground trunks 20 and 21 are out of contact. The cell rows constituting a fundamental circuit can also be configured using the cell as shown in FIG. 2B or 2C instead of the cell as shown in FIG. 2A. Thus, the layout generating section 3 carries out the placement by determining the types and order of the cells to constitute the cell rows, and by determining the order of placement of a plurality of cell rows in accordance with the number of voltage power supplies to be fed to the cells. The processing so far corresponds to the placement step.

Next, in accordance with the connection relationships of the network information, the route generating section 4 carries out general routing of the cells after placement in the layout automatically made by the layout generating section 3. The general routing is a step that divides the entire routing region into multiple divisions in accordance with the routing structure, and assigns general routes of individual networks to the divisions.

Subsequently, the route generating section 4 carries out detailed routing of the cells after the placement on the basis of the general routing result obtained in accordance with the connection relationships of the network information. The detailed routing is a step of completing the final routing in the divisions in accordance with the assignment mentioned above. In this case, using the cells in accordance with the present invention, the route generating section 4 can establish the routing so that the adjacent cells are supplied with different potentials.

A more concrete example will be described with reference to FIG. 2D.

First, the metal line 14 in the cell 7-2 is connected not to the ground trunk 20 including the intra-cell trunk disposed within the cell, but to the ground trunk 21 of the other cell line via the metal line 25. Thus, the ground potential GND2 applied to the ground trunk 21 is supplied to the active region of the NMOSFET 13 in the cell 7-2. In the same cell 7-2, the metal line 10 is connected to the power supply trunk 22 as the metal line 10a by the route generating section 4. Thus, the active region of the PMOSFET 12 in the cell 7-2 is supplied with the power supply voltage VDD1 that is applied to the power supply trunk 22. In this way, the present invention can supply the intra-cell trunks, that is, the partial trunks within each cell, with different potentials.

On the other hand, in the cell 7-1 adjacent to the cell 7-2, the metal line 10 is connected to the power supply trunk 22 as the metal line 10a by the route generating section 4. Accordingly, the cell 7-1 is supplied with the power supply voltage VDD1 that is applied to the power supply trunk 22. In addition, the metal line 14 is connected to the ground trunk 20 as the metal line 14a by the route generating section 4. Thus, although the cell 7-1 and cell 7-2 are placed adjacently to each other, the active regions 13 of their NMOSFETs are supplied with the ground potentials GND1 and GND2, respectively. In this way, it is possible for the present embodiment 1 to supply different potentials even to the adjacent cells.

Likewise, in the cell 7-3, the metal line 10 is connected to the ground trunk 20 via the metal line 24, and the metal line 14 is connected to the power supply trunk 23 as the metal line 14a by the route generating section 4. Accordingly, in the cell 7-3, the active region of the PMOSFET 12 and that of the NMOSFET 13 are supplied with the ground potential GND1 and power supply potential VDD2, respectively.

On the other hand, in the cell 7-4 adjacent to the cell 7-3, the metal line 10 is connected to the ground trunk 21 as the metal line 10a by the route generating section 4, and the metal line 14 is connected to the power supply trunk 23 as the metal line 14a by the route generating section 4. Accordingly, in the cell 7-4, the active region 12 of the PMOSFET is supplied with the ground potential GND2, and the active region 13 of the NMOSFET is supplied with the power supply potential VDD2. Thus, although the cell 7-3 and cell 7-4 are placed adjacently to each other, the active regions 12 of their PMOSFETs 12 are supplied with the ground potentials GND1 and GND2, respectively.

The operation thus far corresponds to the routing step. Subsequently, masks are formed on the basis of the results of the automatic placement and routing, and the semiconductor integrated circuit is built using the masks.

Although the cell as shown in FIG. 2A is used as an example in the foregoing description, the cell as shown in FIG. 2B or 2C is also applicable. As for the cell 7a as shown in FIG. 2B, the metal lines 10 and 14 are removed, and the contacts 11 for connecting to them are also eliminated from the active region 12a of the PMOSFET and the active region 13a of the NMOSFET. Likewise, the metal lines 10 and 14 are also removed from the cell 7b as shown in FIG. 2C. However, the contacts 11a are provided for the active region 12b of the PMOSFET and the active region 13b of the NMOSFET so that the route generating section 4 can connect them to the power supply trunk and ground trunk using metal lines it reads from the storage 2.

As described above, the present embodiment 1 is configured such that it constructs cell rows by placing a plurality of cells adjacently, each of which includes the partial trunks constituting the power supply trunk and/or ground trunk in such a manner as they are electrically isolated from the remaining components within the cell, and that the partial trunks are each connected selectively to any one of the power supply trunks and ground trunks in a plurality of cell rows to supply the potentials to the components inside the cells. As a result, the present embodiment 1 can supply the adjacent cells with the power with different potentials, thereby making it easier to control the potentials to be supplied to the individual cells independently.

Embodiment 2

Figure 3A:
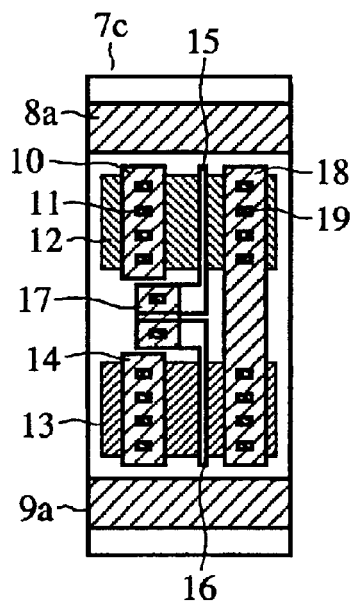
FIGS. 3A–3D are plan views showing configurations of cells and a partial layout used for the layout of a semiconductor integrated circuit of an embodiment 2 in accordance with the present invention.
Figure 3D:
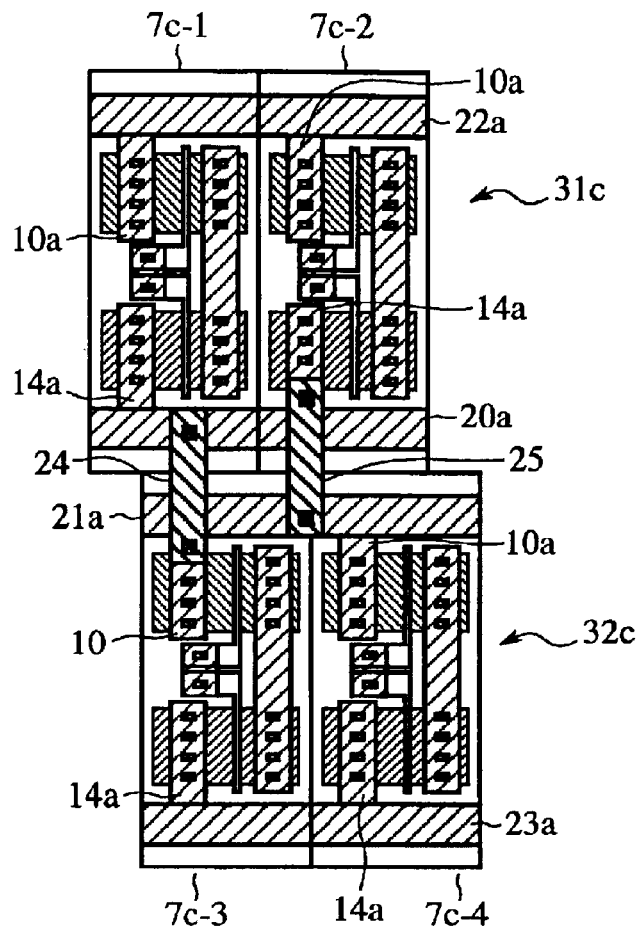
Figure 3B:
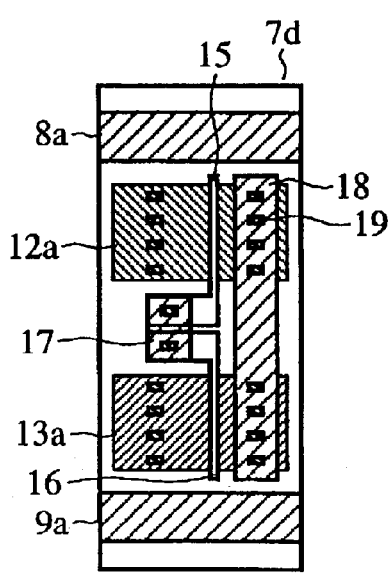
Figure 3C:
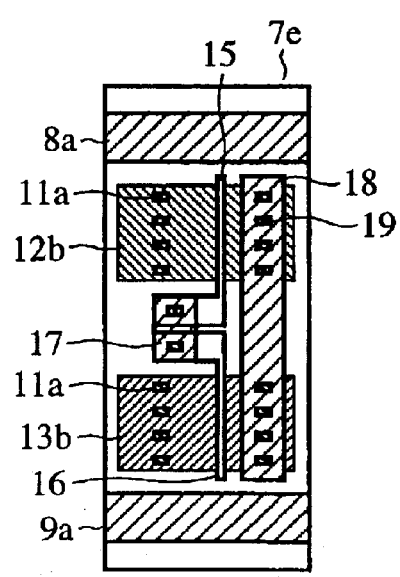

FIGS. 3A–3D are plan views showing configurations of cells and a partial layout used for the layout of the semiconductor integrated circuit of an embodiment 2 in accordance with the present invention. FIGS. 3A–3C show cells constituting the inverter, and FIG. 3D shows a portion of the semiconductor integrated circuit layout after the automatic routing constructed by using the cell of FIG. 3A. In these figures, reference numerals 7c, 7d, 7e, and 7c-1 to 7c-4 each designate a cell, in which intra-cell trunks (partial trunks) constituting the power supply trunk and ground trunk are electrically isolated from the remaining components within the cell. Reference numerals 8a and 9a each designate an intra-cell trunk (partial trunks) disposed apart from a layout frame of the cell (cell frame). The same components as those of FIG. 2 are designated by the same reference numerals, and the description thereof is omitted here.

Next, the outline of the present embodiment 2 will be described.

Here, the description is made by way of example where the layout as shown in FIG. 3D is generated using the cell 7c as shown in FIG. 3A. It is further assumed here that the cells 7c-1 to 7c-4 of FIG. 3D have the same configuration as the cell 7c as shown in FIG. 3A before the automatic placement and routing.

In the foregoing embodiment 1, the intra-cell trunks 8 and 9 are disposed along the layout frame of the cell (cell frame). As a result, to place the cell row 31 consisting of the cells 7-1 and 7-2 next to the cell row 32 consisting of the cells 7-3 and 7-4 as shown in FIG. 2D, they must be separated apart to some extent to prevent the ground trunks 20 and 21 from contacting considering the cell frame.

In contrast with this, in the present embodiment 2, the intra-cell trunks 8a and 9a are separated apart from the layout frame of the cell (cell frame). Accordingly, as shown in FIG. 3D, when placing the cell row 31c consisting of the cells 7c-1 and 7c-2 next to the cell row 32c consisting of the cells 7c-3 and 7c-4, the two cell rows 31c and 32c can be placed with contacting their sides (butting placement).

As described above, the present embodiment 2 is configured such that the partial trunks constituting the power supply trunk and/or ground trunk are disposed apart from the cell frame. Thus, it enables the butting placement of the cell rows, thereby reducing the layout area.

Although the cell 7c as shown in FIG. 3A is used as an example in the foregoing description, the cell as shown in FIG. 3B or 3C is also applicable. As for the cell 7d as shown in FIG. 3B, the metal lines 10 and 14 are removed, and the contacts 11 for connecting to them are also eliminated from the active region 12a of the PMOSFET and the active region 13a of the NMOSFET. Likewise, the metal lines 10 and 14 are removed from the cell 7e as shown in FIG. 3C. However, the contacts 11a are provided for the active region 12b of the PMOSFET and the active region 13b of the NMOSFET so that the route generating section 4 can connect them to the power supply trunk and ground trunk using metal lines it reads from the storage 2.

Embodiment 3

Figure 4A:
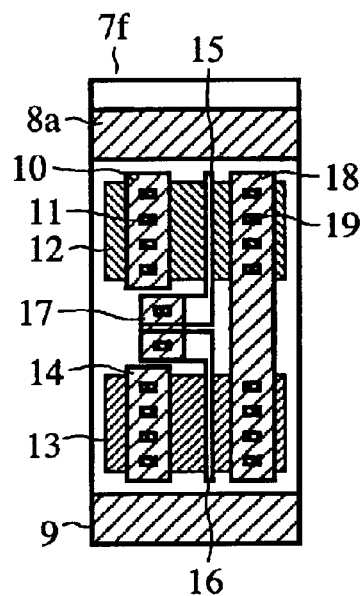
FIGS. 4A–4D are plan views showing configurations of cells and a partial layout used for the layout of a semiconductor integrated circuit of an embodiment 3 in accordance with the present invention.
Figure 4D:
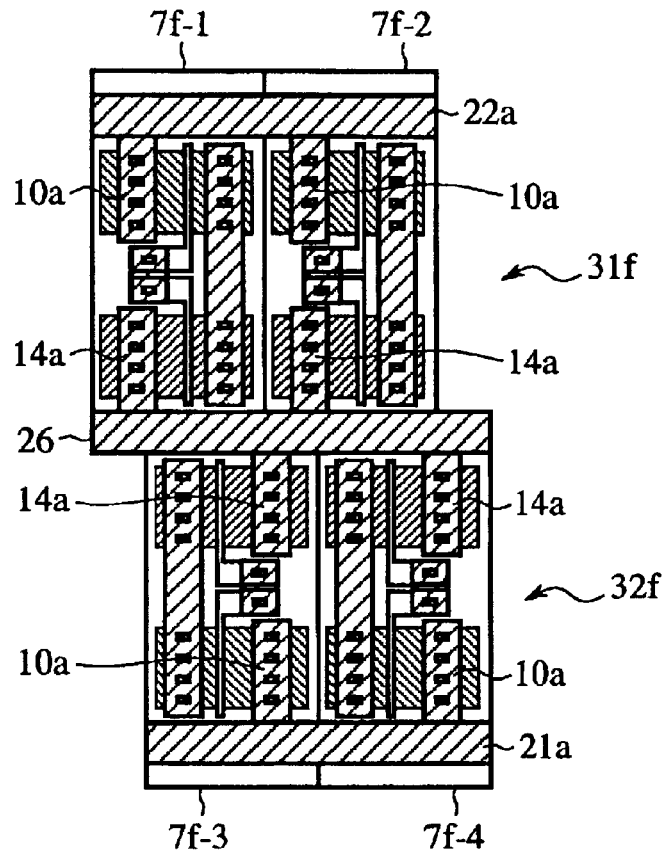
Figure 4B:
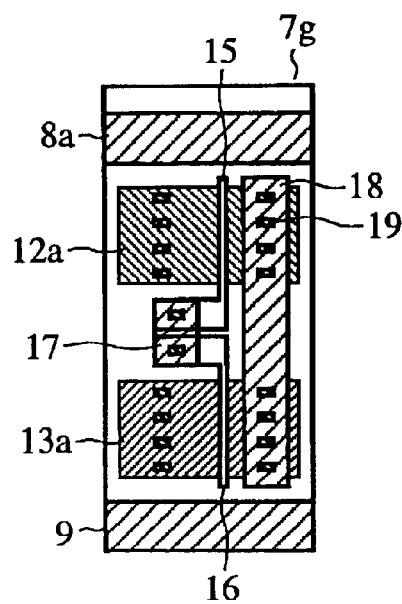
Figure 4C:
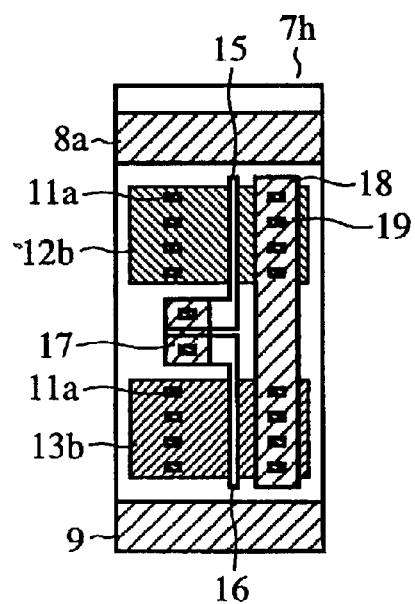

FIGS. 4A–4D are plan views showing configurations of cells and a partial layout used for the layout of the semiconductor integrated circuit of an embodiment 3 in accordance with the present invention. FIGS. 4A–4C show cells constituting the inverter, and FIG. 4D shows a portion of the semiconductor integrated circuit layout after the automatic routing constructed by using the cell of FIG. 4A. In these figures, reference numerals 7f, 7g, 7h, and 7f-1 to 7f-4 each designate a cell with a structure, in which intra-cell trunks (partial trunks) constituting the power supply trunk and ground trunk are electrically isolated from the remaining components within the cell. The reference numeral 26 designates a ground trunk composed of intra-cell trunks of the cells 7f-1–7f-4 shared by the cell row 31f consisting of the cells 7f-1 and 7f-2, and the cell row 32f consisting of the cells 7f-3 and 7f-4. In FIGS. 4A–4D, the same components as those of FIGS. 2A–3D are designated by the same reference numerals, and the description thereof is omitted here.

Next, the outline of the present embodiment 3 will be described.

Here, the description is made by way of example where the layout as shown in FIG. 4D is generated using the cell 7f as shown in FIG. 4A. It is further assumed here that the cells 7f-1 to 7f-4 of FIG. 4D have the same configuration as the cell 7f as shown in FIG. 4A before the automatic placement and routing.

In the foregoing embodiment 1, to place the cell row 31 consisting of the cells 7-1 and 7-2 next to the cell row 32 consisting of the cells 7-3 and 7-4 as shown in FIG. 2D, they must be separated apart by a certain amount to prevent the ground trunks 20 and 21 from contacting.

In addition, in the foregoing embodiment 2, the intra-cell trunks 8a and 9a are separated apart from the layout frame of the cell (cell frame). Accordingly, as shown in FIG. 3D, when placing the cell row 31c consisting of the cells 7c-1 and 7c-2 next to the cell row 32c consisting of the cells 7c-3 and 7c-4, the two cell rows 31c and 32c can be placed with contacting their sides (butting placement).

In the foregoing embodiments 1 and 2, however, the layout area of the cells are fixed, thereby making it impossible to further reduce the layout area.

In view of this, when a plurality of cell rows have the power supply trunk or ground trunk (the ground trunk 26 in the example of FIG. 4D) supplied with the same potential, the present embodiment 3 is configured such that these cell rows share the same trunk between them. The configuration can further reduce the layout area, and obviate the need for considering the variations in the potentials due to the individual difference of the trunks to which the same potential is to be fed. As a result, the present embodiment 3 can improve the reliability of the semiconductor integrated circuit with this layout.

As a concrete example, the cell row 31f consisting of the cells 7f-1 and 7f-2 is placed such that its intra-cell trunk contacts the intra-cell trunk of the cell row 32f consisting of the cells 7f-3 and 7f-4 (butting placement). Thus, the cells 7f-1–7f-4 share the ground trunk 26 between them.

As for the cells of FIGS. 4A–4C, for example, it is possible to adjust the layout such that the width of the ground trunk 26 is made equal to the width of the ground trunk 9 in the butting placement, where the cell rows 31f and 32f share the ground trunk. Thus, the layout area can be reduced by an amount corresponding to the width of the intra-cell trunks of the individual cells.

Although the foregoing example shares the ground trunk 26, this is not essential. For example, the present embodiment 3 is also applicable to any trunks that share the same potential between a plurality of cell rows such as sharing only the power supply trunk or both the power supply trunk and ground trunk.

As described above, the present embodiment 3 is configured such that a plurality of cell rows 31f and 32f share the power supply trunk or ground trunk for supplying the same potential. Thus, it can reduce the layout area by an amount corresponding to the trunks shared. In addition, it can eliminate the potential variations due to the individual difference between the trunks to which the same potential is to be supplied. As a result, it can improve the reliability of the semiconductor integrated circuit based on such a layout.

Although the cell 7f as shown in FIG. 4A is used in the present embodiment 3, the cell as shown in FIG. 4B or 4C is also applicable. As for the cell 7g as shown in FIG. 4B, the metal lines 10 and 14 are eliminated, and the contacts 11 for connecting to them are also eliminated from the active region 12a of the PMOSFET and the active region 13a of the NMOSFET. Likewise, the metal lines 10 and 14 are eliminated from the cell 7h as shown in FIG. 4C. However, the contacts 11a are provided for the active region 12b of the PMOSFET and the active region 13b of the NMOSFET so that the route generating section 4 can connect them to the power supply trunk and ground trunk using metal lines it reads from the storage 2.

The cells with the following structures are also applicable to the foregoing embodiment 3.

FIGS. 5A–5E are plan views showing variations of the cells used for the layout of the semiconductor integrated circuit of the present embodiment 3, which constitute an inverter. In these figures, the cells 7i–7m each include the intra-cell trunk (partial trunk) 8 or 8a constituting the power supply trunk or ground trunk, which is electrically isolated from the remaining components. On the other hand, the intra-cell trunk 9 or 9a constituting the ground trunk to be shared by a plurality of cell rows are configured such that it is connected to the active region 13 to which the ground potential of the ground trunk is to be supplied via the metal line 14a. Here, the same components as those of FIGS. 2A–4D are designated by the same reference numerals, and the description thereof is omitted here.

The cell 7i as shown in FIG. 5A is configured such that its intra-cell trunk 9 constituting the ground trunk 26 (see, FIG. 4D) is connected to the active region 13 of the NMOSFET via the metal line 14a. On the other hand, the unshared intra-cell trunk 8 is isolated from the other components as in the foregoing embodiment 1. As for the cell 7j as shown in FIG. 5B, the metal line 10 is removed together with the contacts 11 that connect it to the active region 12a of the PMOSFET. However, the active region 13a of the NMOSFET is connected to the ground trunk 9 within the cell via the contacts 11a and metal line 14a.

As for the cell 7k as shown in FIG. 5C, although the metal line 10 is removed, the active region 12b of the PMOSFET is provided with the contacts 11a so that it can be connected to the power supply trunk or ground trunk through the metal line the route generating section 4 reads from the storage 2. Although the cell 7l as shown in FIG. 5D has the same basic structure as the cell 7i as shown in FIG. 5A, it includes the intra-cell trunk 8a and intra-cell trunk 9a disposed apart from the cell frame. With the configuration, a plurality of cell rows cannot share a common trunk in contact. However, the plurality of cell rows can share the trunks placed adjacently and connected to each other, offering similar advantages.

Finally, the cell 7m shown in FIG. 5E has the same basic configuration as the cell 7i except that it has its intra-cell trunk 8a separated from the cell frame. With such a structure, it is possible to achieve the butting placement of the cell rows at the side where the trunks are not shared, thereby further reducing the layout area.

As described above, the processing load of the automatic routing can be reduced by connecting a component in the cell to the trunk shared by the plurality of cell rows in advance. The configurations are applicable not only to the foregoing embodiments, but also to the following embodiments, offering similar advantages.

Embodiment 4

Figure 6A:
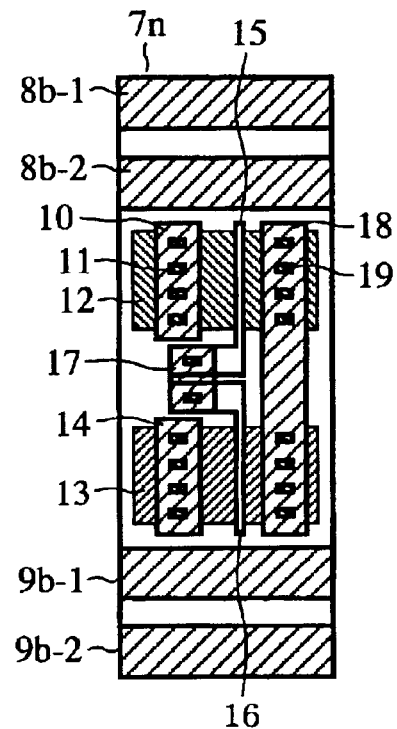
FIGS. 6A–6B are plan views showing configurations of cells used for the layout of a semiconductor integrated circuit of an embodiment 4 in accordance with the present invention.
Figure 6B:
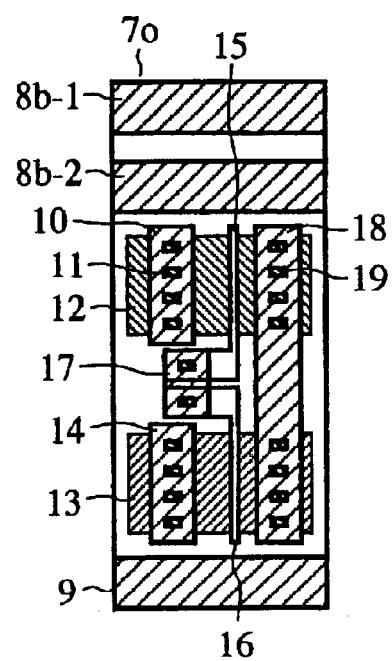

FIGS. 6A and 6B are plan views showing cells used for the layout of a semiconductor integrated circuit of an embodiment 4 in accordance with the present invention, in which case, the cells are an inverter. In these figures, the reference numeral 7n designates a cell including two intra-cell trunks (partial trunks) constituting the power supply trunk, and two intra-cell trunks (partial trunks) constituting the ground trunk; and 7o is a cell including two intra-cell trunks (partial trunks) constituting one of the power supply trunk and ground trunk. Reference numerals 8b-1 and 8b-2 designate the two intra-cell trunks (partial trunks) that are placed in the cells 7n and 7o, and are electrically isolated from the remaining components. Reference numerals 9b-1 and 9b-2 designate two intra-cell trunks (partial trunks) that are placed in the cell 7n, and are electrically isolated from the remaining components. The same components as those of FIGS. 2A–2D are designated by the same reference numerals, and the description thereof is omitted here.

Next, the outline of the present embodiment 4 will be described.

For example, disposing a plurality of cells 7n of FIG. 6A will construct a cell row including two power supply trunks (or ground trunks) consisting of the intra-cell trunks 8b-1 and 8b-2, and two ground trunks (or power supply trunks) consisting of the intra-cell trunks 9b-1 and 9b-2. Thus, two power supply systems are formed for one cell row.

When a plurality of cell rows include power supply trunks or ground trunks for supplying the same potential, a configuration is assembled in which the trunks are formed using the intra-cell trunks 8b-1 or intra-cell trunks 9b-2 disposed along the cell frame. Thus, the plurality of cell rows can share the trunks, thereby further reducing the layout area.

In addition, it is possible concerning the ground to place only the intra-cell trunk 9 along the cell frame just as the cell 7o shown in FIG. 6B. Thus, only the trunk consisting of the intra-cell trunks 9 is shared by a plurality of cell rows, thereby making it possible to further reduce the layout area.

The power supply trunks and ground trunks constituting the cell row have no electric connections with the remaining components within the cell before the automatic routing. Therefore, it is possible for the route generating section 4 to carry out the routing such that each cell is supplied with a potential from a trunk other than the trunks consisting of the intra-cell trunks in the cell. As a result, the present embodiment 4 can further increase flexibility of multiple power supplies in the semiconductor integrated circuit.

Although FIGS. 6A and 6B show configurations based on the inverter as shown in FIG. 2A, they may be based on the other configurations of the inverter described in the foregoing embodiments.

As described above, the present embodiment 4 is configured such that the cell includes a plurality of partial trunks for constituting the power supply trunks or ground trunks. Accordingly, the present embodiment 4 can increase the degree of flexibility of the multiple power supply system of the semiconductor integrated circuit.

Embodiment 5

Figure 7A:
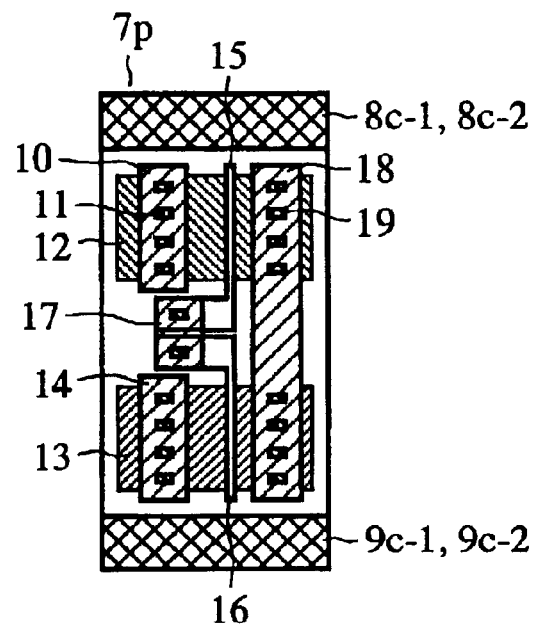
FIGS. 7A–7B are plan views showing configurations of cells used for the layout of a semiconductor integrated circuit of an embodiment 5 in accordance with the present invention.
Figure 7B:
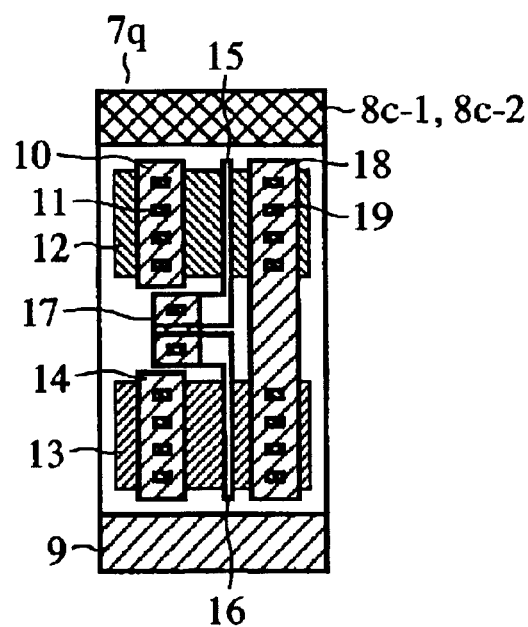
Figure 8:
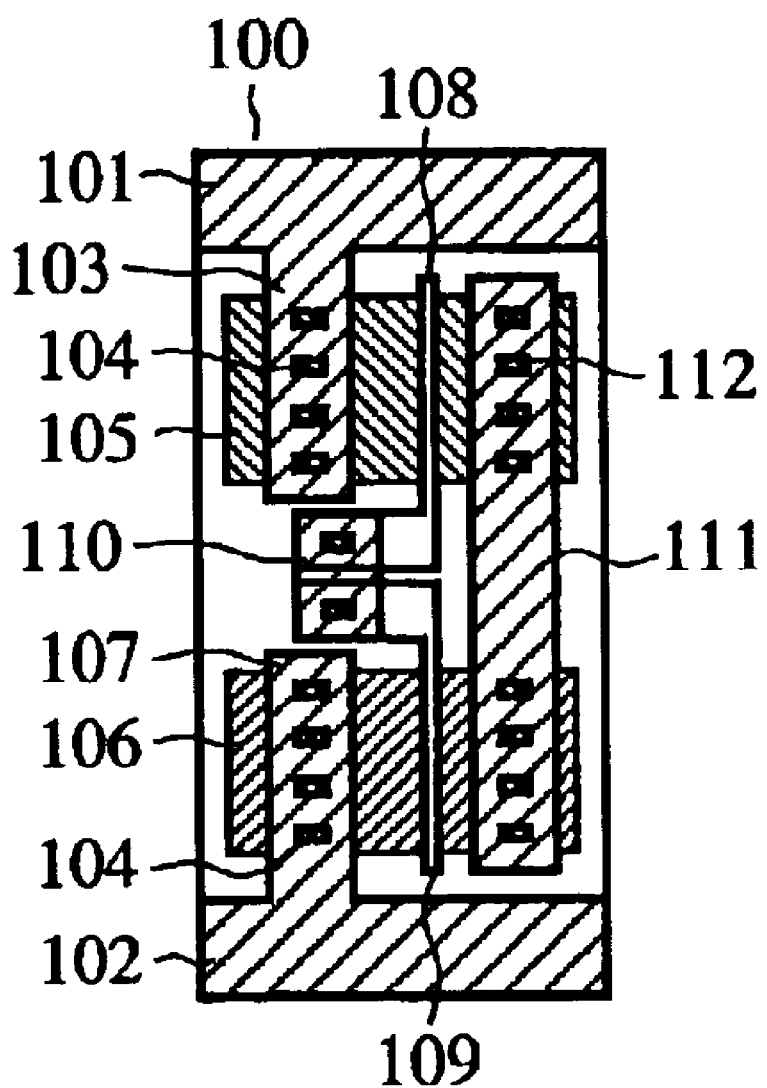
FIG. 8 is a plan view showing a cell structure used for designing a conventional semiconductor integrated circuit.

FIGS. 7A and 7B are plan views showing cells used for the layout of a semiconductor integrated circuit of an embodiment 5 in accordance with the present invention, in which case, the cells is an inverter. In these figures, the reference numeral 7p designates a cell including on different layers two intra-cell trunks (partial trunks) constituting the power supply trunks, and two intra-cell trunks (partial trunks) constituting the ground trunks; and 7q designates a cell including two intra-cell trunks (partial trunks) constituting the power supply trunks (or ground trunks) on different layers. Reference numerals 8c-1 and 8c-2 designate the two intra-cell trunks (partial trunks) that are placed in the cells 7p and 7q, and are electrically isolated from the remaining components on the different layers. Reference numerals 9b-1 and 9b-2 designate two intra-cell trunks (partial trunks) that are placed in the cell 7p, and are electrically isolated from the remaining components on the different layers. The same components as those of FIGS. 2A–2D are designated by the same reference numerals, and the description thereof is omitted here.

Next, the outline of the present embodiment 5 will be described.

For example, disposing a plurality of cells 7p of FIG. 7A will construct a cell row including on the two different layers two power supply trunks (or ground trunks) consisting of the intra-cell trunks 8c-1 and 8c-2, and two ground trunks (or power supply trunks) consisting of the intra-cell trunks 9c-1 and 9c-2. Thus, two power supply systems are formed by one cell row without increasing the layout area because the plurality of trunks are formed on the different layers.

In addition, it is possible concerning the ground (or power supply trunk) to place only the intra-cell trunk 9 along the cell frame just as the cell 7q shown in FIG. 7B. Thus, only the ground trunk (or power supply trunk) consisting of the intra-cell trunks 9 is shared by a plurality of cell rows, thereby making it possible to further reduce the layout area.

The power supply trunks and ground trunks constituting the cell row have no electric connections with the remaining components within the cell before the automatic routing. Therefore, by adding the function of performing the routing between the different layers, the route generating section 4 can carry out the routing such that each cell is supplied with a potential from the power supply trunk or ground trunk consisting of the intra-cell trunks on the different layers. As a result, the present embodiment 5 can further increase flexibility of multiple power supply system in the semiconductor integrated circuit with the configuration.

Although the intra-cell trunks on the different layers are aligned completely in FIGS. 7A and 7B, they can have different width and overlap on each other partly.

Although FIGS. 7A and 7B show configurations based on the inverter as shown in FIG. 2A, they may be based on the other configurations of the inverter described in the foregoing embodiments.

As described above, the present embodiment 5 is configured such that the cell includes a plurality of intra-cell trunks on different layers. Accordingly, the present embodiment 5 can increase the degree of flexibility of the multiple power supply system of the semiconductor integrated circuit, and prevent an increase in the layout area due to the plurality of trunks.

Although the foregoing embodiments 1–5 are described by way of example of the cell including the power supply trunk and ground trunk consisting of the intra-cell trunks, the present invention is not limited to such configurations. For example, the cell can have only one of the power supply trunk and ground trunk consisting of the intra-cell trunks. In other words, the cell data stored in the storage 2 do not specify in advance about whether the intra-cell trunks constitute the power supply trunk or the ground trunk. Thus, it is enough for the storage 2 to store a few types of the cells described in the foregoing embodiments as the basic structures, thereby reducing the volume of the cell data to be stored.

What is claimed is:

1. A semiconductor integrated circuit comprising:
   cells each of which includes at least one partial trunk used to constitute at least one of power supply trunk and ground trunk, the partial trunk being electrically isolated from remaining components within the cell;
   a plurality of cell rows each of which includes a plurality of cells placed adjacently, and includes at least one of the power supply trunk and ground trunk composed of the partial trunks; and
   potential feeders selectively connected to one of the power supply trunk and ground trunk of any one of the plurality of cell rows to supply components within cells with at least two routes of different potentials fed to the plurality of power supply trunks and ground trunks.

2. The semiconductor integrated circuit according to claim 1, wherein the partial trunk used for constituting one of power supply trunk and ground trunk is placed apart from a cell frame.

3. The semiconductor integrated circuit according to claim 1, wherein when said plurality of cell rows include, among their power supply trunks and ground trunks, at least two trunks that supply a same potential, the two trunks are unified to be shared by the cell rows associated with the trunks.

4. The semiconductor integrated circuit according to claim 3, wherein the cells, which include the trunks shared by a plurality of cell rows, have their partial trunks constituting the trunks connected in advance to their internal components to which the potential is to be supplied.

5. The semiconductor integrated circuit according to claim 1, wherein the cells each comprise a plurality of partial trunks constituting at least one of power supply trunk and ground trunk.

6. The semiconductor integrated circuit according to claim 5, wherein the cells each comprise the plurality of partial trunks on different layers.

* * * * *